US009893817B2

(12) United States Patent
Venter et al.

(10) Patent No.: US 9,893,817 B2
(45) Date of Patent: Feb. 13, 2018

(54) PROGRAMMABLE INTEGRATED CIRCUIT (IC) CONTAINING AN INTEGRATED OPTICAL TRANSDUCER FOR PROGRAMMING THE IC, AND A RELATED IC PROGRAMMING SYSTEM AND METHOD

(71) Applicant: INSiAVA (Pty) Ltd., Pretoria (ZA)

(72) Inventors: Petrus Johannes Venter, Menlo Park (ZA); Marius Eugene Goosen, Centurion (ZA); Christo Janse Van Rensburg, Pretoria (ZA); Nicolaas Matteus Fauré, Pretoria (ZA)

(73) Assignee: INSiAVA (Pty) Ltd., Pretoria (ZA)

( * ) Notice: Subject to any disclaimer, the term of this patent is extended or adjusted under 35 U.S.C. 154(b) by 0 days.

(21) Appl. No.: 15/315,138

(22) PCT Filed: May 28, 2015

(86) PCT No.: PCT/IB2015/054000
§ 371 (c)(1),
(2) Date: Nov. 30, 2016

(87) PCT Pub. No.: WO2015/181760
PCT Pub. Date: Dec. 3, 2015

(65) Prior Publication Data
US 2017/0214475 A1 Jul. 27, 2017

(30) Foreign Application Priority Data

May 30, 2014 (ZA) ................................. 2014/03994
Oct. 8, 2014 (ZA) ................................. 2014/07308

(51) Int. Cl.
*H04B 10/40* (2013.01)
*H04B 10/80* (2013.01)
(Continued)

(52) U.S. Cl.
CPC ......... *H04B 10/801* (2013.01); *G06F 1/3296* (2013.01); *G06F 13/4282* (2013.01);
(Continued)

(58) Field of Classification Search
CPC . H04B 10/801; G06F 1/3296; G06F 13/4282; G11C 16/102; G11C 2216/30; H01L 31/125; H03K 19/17748
(Continued)

(56) References Cited

U.S. PATENT DOCUMENTS 5,003,251 A     3/1991  Fuoco
6,393,183 B1 *  5/2002  Worley ................. G02B 6/122
                                                          257/81
(Continued)

OTHER PUBLICATIONS

International Search Report from parent PCT application PCT/IB2015/054000 dated Oct. 1, 2015.

*Primary Examiner* — Daniel D Chang
(74) *Attorney, Agent, or Firm* — Foley Hoag LLP; Dana M. Gordon

(57) ABSTRACT

A programmable integrated circuit (IC) comprising a single body of semiconductor is disclosed. The IC comprises at least one optical transducer as an integral part of the programmable integrated circuit on the same body of semiconductor, the optical transducer being operable to receive an optical input indicative of programming instructions and at least one storage element communicatively coupled to the optical transducer and being operable to store thereon the programming instructions or an adaptation thereof. The programming instructions received via the optical input are configured to direct the operation of the IC.

23 Claims, 13 Drawing Sheets

(51) Int. Cl.
  *G11C 16/10* (2006.01)
  *G06F 13/42* (2006.01)
  *G06F 1/32* (2006.01)
  *H03K 19/177* (2006.01)
  *H01L 31/12* (2006.01)

(52) U.S. Cl.
  CPC .......... *G11C 16/102* (2013.01); *H01L 31/125* (2013.01); *H03K 19/17748* (2013.01); *G11C 2216/30* (2013.01)

(58) Field of Classification Search
  USPC ................. 326/38; 398/79, 133, 135, 202
  See application file for complete search history.

(56) References Cited

U.S. PATENT DOCUMENTS

| | | | |
|---|---|---|---|
| 6,410,941 B1* | 6/2002 | Taylor | H01L 27/15 257/441 |
| 2004/0138845 A1 | 7/2004 | Park et al. | |
| 2005/0253136 A1 | 11/2005 | Ono et al. | |
| 2008/0185618 A1* | 8/2008 | Chu | H01L 31/101 257/292 |
| 2012/0194565 A1 | 8/2012 | White et al. | |
| 2013/0328416 A1* | 12/2013 | Whitworth | H02J 50/30 307/149 |

\* cited by examiner

PROGRAMMABLE INTEGRATED CIRCUIT (IC) CONTAINING AN INTEGRATED OPTICAL TRANSDUCER FOR PROGRAMMING THE IC, AND A RELATED IC PROGRAMMING SYSTEM AND METHOD

RELATED APPLICATIONS

This application is the U.S. national phase of International Patent Application No. PCT/IB2015/05400, filed May 28, 2015, which claims the benefit of South Africa patent applications 2014/03994, filed on May 30, 2014, and 2014/07308, filed on Oct. 8, 2014.

FIELD OF DISCLOSURE

This disclosure relates broadly to programmable integrated circuits and specifically provides for a programmable integrated circuit (IC) containing an integrated optical transducer to realise an interface capable of interacting with, programming, and erasing programmed content of the integrated circuit over an optical link. Integrated circuits generally include microcontrollers, microprocessors, programmable logic devices, FPGAs, DSPs, programmable sensors and other types of programmable analogue and digital circuitry.

BACKGROUND OF DISCLOSURE

Integrated circuits (ICs) are ubiquitous electronic devices that operate in almost all imaginable settings and environments. A large family of integrated circuits, namely programmable integrated circuits, require user customisation in order to perform the required function and to serve its intended purpose. Practically all programmable ICs require programming or configuring in order to enable the user customisation.

Conventional means of programming or configuring ICs rely on a physical and potentially invasive electrical connection, and usually multiple electric connections, to the programmable device, which:
  needs to be considered when implementing the device both on an IC and printed circuit board level;
  requires additional lead-out pins on the IC package; and requires direct access to the electrical interface from the printed circuit board.

It would be advantageous to program ICs without requiring a physical connection in order to enhance flexibility and configurability of systems incorporating programmable ICs.

The hardware associated with establishing the programming functionality (e.g., cables, connectors, bondwires) contribute to the overall cost of manufacturing and implementing of these programmable integrated circuits. Additionally, these physical connections also add to the maintenance and debugging complexities, further increasing the implementation cost of programmable devices.

FIG. 1 illustrates a typical tool chain 10 required for configuring and/or programming ICs 16. The term "programming" of an integrated circuit usually means to send data to an IC in order to configure the IC to act in a specified way or perform a specified function, depending on the programming data communicated to the IC. The term can also apply to batch and wafer scale configuration of ICs which may take place before dicing the individual ICs. Programming often relies on bidirectional communication between a host (sometimes called the information source), that is, the device that communicates the source configuration data to the IC, and the IC itself.

In order to establish interaction between the host and the target IC, an intermediate "programming tool/programmer/debugger" 14 is required to translate user instructions and program code from a host or information source 12 into an electrical representation understandable by the target device 16 e.g. an electronic data bit stream. Interaction is, however, not limited to programming but can include communicating the current state of the IC, communicating additional operational and functional inputs and outputs to and from the IC and stream information between the host device and the IC. The communicable bit stream can as a result be comprised of any of the following: configuration data, programming data, debugging commands, device information, current state of the IC and any combinations thereof. The host 12 is connected to the programming tool 14 by means of a wired or wireless comm. link 12a.

Various programmable IC vendors have addressed in-circuit programming and debugging, although all systems, with the exception of radiofrequency ICs, still require a physical electrical connection 14a to the programmable IC for enabling this feature. Very specialised methods and standards exist to enhance or improve the usability of this approach, i.e. JTAG standard and Microchip's proprietary in-circuit serial programming (ICSP) technique. These specialised methods include multiple device programming, configuration, debugging, low voltage operability and flexibility on-chip. To allow multiple device programming, configuration and debugging, the devices are electrically daisy chained, or connected in a star topology, according to the specified standard with a distinct point of entry, typically still a physical electrical interface. Furthermore, further reuse of electrical pins beyond their reserved programming and debugging functions might involve the use of additional circuits consuming valuable space on printed circuit boards.

The Applicant desires a non-invasive mechanism, through which interaction with an integrated circuit can be effected, allowing for in situ updates, erasing, programming and reprogramming, debugging and other functions to be carried out without the need to electrically connect to the programmable device is therefore advantageous when compared to the invasive electrical method of interaction. Such an approach negates the need for physical removal of an IC from its participation in an electronic system and allows interaction with an IC without the need for disrupting its function unnecessarily.

SUMMARY OF DISCLOSURE

Accordingly, this disclosure provides a programmable integrated circuit (IC) comprising a single body of semiconductor, the IC including:
  at least one optical transducer as an integral part of the programmable integrated circuit on the same body of semiconductor, the optical transducer being operable to receive an optical input indicative of programming instructions; and
  at least one storage element communicatively coupled to the optical transducer and being operable to store thereon the programming instructions or an adaptation thereof,
wherein the programming instructions received via the optical input are configured to direct the operation of the IC.

There may be plural optical transducers. The, or each, optical transducer may additionally serve as a light emitter. The, or each, optical transducer may be bidirectional. The term programmable IC includes integrated circuit devices which have the ability to be programmed (and optionally erased) by means of a programming event in such a way that the programming event alters the behaviour or manner of functioning of the IC based on the details of such program content or program data. An integrated circuit, in turn, refers to any configuration of electronic circuit elements incorporated onto a single body of semiconductor material where such circuit elements can be of analogue or digital nature, or a combination of both in the form of a mixed signal integrated circuit. The inclusion of micro-electro-mechanical elements may also be present as part of such an integrated circuit.

It is often useful to perform such programming interactions with the programmable IC already implemented in its intended setting, or at least in a setting representing its intended eventual environment. For example, a microcontroller developer will often develop a piece of code, or program data, which can be compiled or directly created in the form of a list of operation codes and data instructions specific to the microcontroller which needs to perform a specific function. This program data will be communicated to the microcontroller and stored on its internal memory. Often, as part of the development environment, the developer will incorporate the microcontroller as part of a system representing its intended use, thereby electrically connecting the microcontroller to other circuit components. While developing, numerous updates and changes will require frequent programming of the device. Often, removal or at least partial deactivation of the larger electronic setting is required. Furthermore, once a developer deploys the larger circuit containing a microcontroller, updates to the program code, or firmware, can often require programming the IC in situ. This can more readily be achieved using the optical transducer to communicate the programming instructions.

In general, optical interaction is one way of interacting with ICs without the need for a physical electrical connection. One simple example of optical interaction has been used for decades for deprogramming or erasing EPROM devices by using ultraviolet light directly on the memory elements on an IC. Since UV light is required to physically reach the IC, quartz windows are used for uninhibited optical access to the IC body. However, these interactions are not of a reciprocal nature and represent a one-directional interaction without any information being transferred between the illumination source and the IC.

Light emission from crystalline silicon is possible although not very efficient due to the material's indirect band gap properties. There are generally two methods by which to generate light in a standard CMOS integrated circuit where no hybridisation is necessary:

radiative recombination of minority carriers through forward-biased injection in a silicon pn-junction; and
  radiative carrier interactions under high electric fields, observable when inducing carrier transport through reverse-biased pn-junctions in avalanche breakdown.

It is worth noting that all standard CMOS and SOI-CMOS integrated circuits use crystalline silicon as fundamental active/device layer. Henceforth, all reference made to silicon is typically made with respect to crystalline silicon and should be interpreted as such unless the context indicates otherwise.

The first technique emits light invisible to the human eye with a photon energy distribution around the band gap energy of silicon (approximately 1100 nm). The second technique typically emits a broad spectrum of light in the region of 400-900 nm, depending on the electric field profile. The latter technique allows light emission and detection in the same material and is a unique feature which can be exploited to enable optical interaction with a programmable IC. Light emitted from forward biased junctions (in the region of and around 1100 nm) can be detected by silicon itself, albeit not optimally. Other detector materials exist which could be used in a complete optical programming system as a means to establish communication from the IC to the programming tool with the programming tool containing a detector better suited for detecting the emitted light. Since silicon can be used both as light emitter and for photodetection, bidirectional communication between an IC and an external optical transceiver becomes possible. The optical transducer may therefore be an optical detector or photodetector. The optical transducer may be operated in a forward-biased or reverse-biased mode to cause light emission.

The storage element may be an integral part of the same body of semiconductor as the IC. Instead, the storage element may be external to the IC but connected thereto by a communication link or bus. More particularly, the IC may contain storage elements, or circuit elements which allow the IC to have memory, and this memory may be of volatile or non-volatile nature. Although a programmable integrated circuit may have this memory as integral part of the same body of semiconductor, the interpretation should be held that memory on its own may or may not be external to a programmable integrated circuit, as long as the integrated circuit itself has the ability to be programmed and/or erased. In other words, the IC may potentially rely on external memory in order to store program data which affects its function. Examples of programmable ICs include microcontrollers, microprocessors, programmable logic devices (PLDs), field programmable gate arrays (FPGAs), digital signal processors (DSPs), programmable amplifiers, programmable voltage regulators and memories such as EPROM, EEPROM, flash memory, SRAM, DRAM, VRAM and similar devices.

In one embodiment, avalanche electroluminescent devices may be employed to provide for the possibility of both emitting and detecting light on the same semiconductor substrate. The nature of the substrate will usually be silicon or a silicon based material in order to support a CMOS/BiCMOS or CMOS SOI process. Since it is known that a semiconductor can act as a light emitter, it may be possible to have a light emitting device as a transducer on a programmable IC. Silicon and germanium are, however, indirect band gap materials and therefore not necessarily efficient optical emitters. Moreover, practically all programmable ICs are fabricated on a silicon or silicon-based substrate, including SOI of which the active device layer is still silicon or silicon-based. Other semiconductor materials exist which might also find suitability in integrating both an optical detector and light emitter in the same body of semiconductor. These include but are not limited to GaN, GaAs, InP, etc.

By integrating an optical emitter, optical detector and a programmable IC on the same semiconductor substrate, it may become possible to interact with such a programmable IC in a wireless and potentially contactless way. This capability may have several advantages over existing electrical and RF interfaces, such as:

true in-circuit debugging, programming and erasing and
  improved utilisation of I/O pins and interfaces The current disclosure makes it possible to batch-program larger quantities of ICs that have already been diced or for wafer-scale blanket programming before the individual components are diced out of the wafer.

Light emitters and detectors as integrated transducers are not always very efficient. In some cases a preferred way of interacting with the programmable IC may be through the use of an external programming tool with its own optical transducers. Since these transducers may be discrete in nature, an optimal choice may be exercised on the programming host's side e.g. as implemented in the programming tool. For example, a high powered LED or laser may be used along with an avalanche photodiode on the programming host's side, which may leave room for less efficient transducers on chip.

Using a high powered light source off-chip may enable the programmable IC to extract the necessary electrical power to support the programming transaction directly from the external light source. For example, a laser may produce sufficient amount of optical power which, in turn, may be converted to electrical power on chip, to be used in powering the electrical circuitry necessary to support the programming event. This may potentially allow the incorporation of an energy harvesting (sometimes referred to as energy scavenging or recovery) component on the IC whereby it becomes completely unnecessary to supply external electrical power to the programmable IC during a programming event. The combination of a high power light source and an energy harvesting component and circuitry hence provides another option for power generation as opposed to conventional radiofrequency, microwave and mm-wave techniques. The energy harvesting component may be integral with the optical transducer.

Accordingly, the disclosure extends to an IC programming system which includes:
the IC as defined above; and
an external programming tool having at least one optical transducer (the external transducer) operable to interact with the optical transducer (the integral transducer) of the IC Optical access to the integrated circuit die may be made possible in a number of ways. The traditional (PRIOR ART) method of erasing EPROM memories necessitated the existence of quartz windows as part of a ceramic package in order to optically access the integrated circuit inside the package. The quartz material is used to prevent excessive absorption of UV light since quartz is known to be optically transparent to UV light.

Where the IC in accordance with the disclosure is directly bonded to a PCB or other similar substrate, it may be possible to illuminate the IC directly without the need for an optical window. Quartz windows are expensive and so are the ceramic packages typically associated with them.

In the current disclosure it is proposed that the quartz or quartz-like window may be replaced by a polymer based material (a certain type of which is commonly referred to as 'plastic') or any other relatively inexpensive material suitable for mass manufacture of the window. This is due to the wavelengths used by the integrated transducers which typically span the visible to near-infrared regions. Without the constraint of facilitating UV transmission, for example, it becomes possible to fuse plastic optical windows into plastic packages. This enables an optical access port, not only restricted to ceramic packages, but also for the majority of existing packages used to house programmable ICs. Furthermore, such a plastic window may be shaped into a lens or other optical element capable of manipulating the optical path between the IC and a point external to the IC package.

The disclosure extends further to a method of programming or interrogating a programmable IC comprising a single body of semiconductor, the method including:
receiving, by at least one optical transducer as an integral part of the IC on the same body of semiconductor, an optical input indicative of programming instructions; and
storing, on at least one storage element communicatively coupled to the optical transducer, the programming instructions or an adaptation thereof,
wherein the programming instructions received via the optical input are configured to direct the operation of the IC.

BRIEF DESCRIPTION OF DRAWINGS

The disclosure will now be further described, by way of example, with reference to the accompanying diagrammatic drawings.

In the drawings.

DETAILED DESCRIPTION OF EXAMPLE EMBODIMENT

The following description of the disclosure is provided as an enabling teaching of the disclosure. Those skilled in the relevant art will recognise that many changes can be made to the embodiment described, while still attaining the beneficial results of the present disclosure. It will also be apparent that some of the desired benefits of the present disclosure can be attained by selecting some of the features of the present disclosure without utilising other features. Accordingly, those skilled in the art will recognise that modifications and adaptations to the present disclosure are possible and can even be desirable in certain circumstances, and are a part of the present disclosure. Thus, the following description is provided as illustrative of the principles of the present disclosure and not a limitation thereof.

Figure 2:
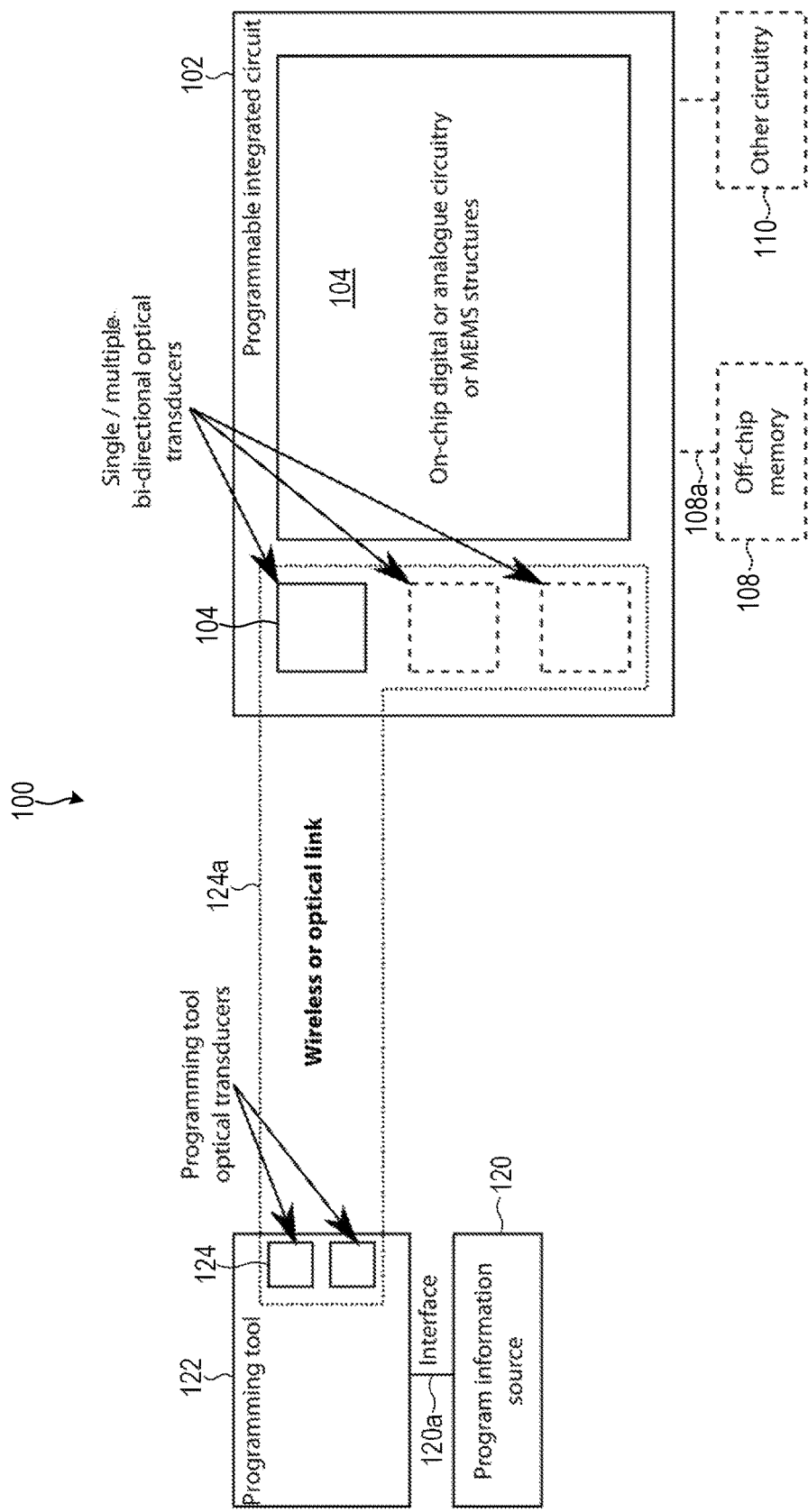
FIG. 2 shows a schematic view of an IC programming system, in accordance with the disclosure, including a programmable IC, also in accordance with the disclosure.

FIG. 2 illustrates an IC programming system 100, in accordance with the disclosure. The IC programming system 100 has a programmable IC 102, in accordance with the disclosure. The IC 102 has at least one optical transducer 104. In this embodiment, the IC 102 has multiple optical transducers 104 which are configured for bidirectional communication. (A unidirectional embodiment may also be practicable and is included in the scope of the disclosure.)

The IC 102 has a storage element 106 which may be on-chip (digital or analogue) circuitry or MEMS (micro-electromechanical systems) structure. In an alternative embodiment, the IC 102 may include off-chip memory 108 connected to the IC 102 by a comm. link or bus 108a. The IC 102 may optionally include additional circuitry 110, either on-chip or off-chip, e.g., energy harvesting circuitry.

A program information source (e.g., a computer server or digital controller) 120 is connected via a communication interface 120a to a programming tool 122. The programming tool 122 has optical transducers 124 (referred to as the external transducer(s)) complemental to, but potentially different from, those of the IC 102 (referred to as the integral transducer(s)). The external transducers 124 and the integral transducer 104 are configured to establish an optical link 124a, containing an optical input indicative of programming instructions, between the programming tool 122 and the IC 102. The term "programming instructions" in the context of this specification also includes interrogation instructions to direct the IC 102 to respond accordingly. For example, a programming instruction may include an interrogation or debugging command which causes the IC 102 to respond by indicating its current state. Thus, it will be noted that the same programming tool 122 could also be employed as debugging tool for the purpose of determining the correct functioning of the IC 102. (The programming tool 122 may also be considered as an interrogator or debugging tool, depending on its specific implementation.)

It will be appreciated that conventional (PRIOR ART) wired programming pins have been replaced by the optical transducers 104, 124 enabling optical programming/debugging. The need for electrical connection is thus removed; if space permits it, the old programming pins can be used as general I/O pins without the need for additional external circuitry and components. Alternatively, it might be plausible for the IC to become smaller by removing the electrical pins, resulting in a cost saving per IC die.

Figure 3:
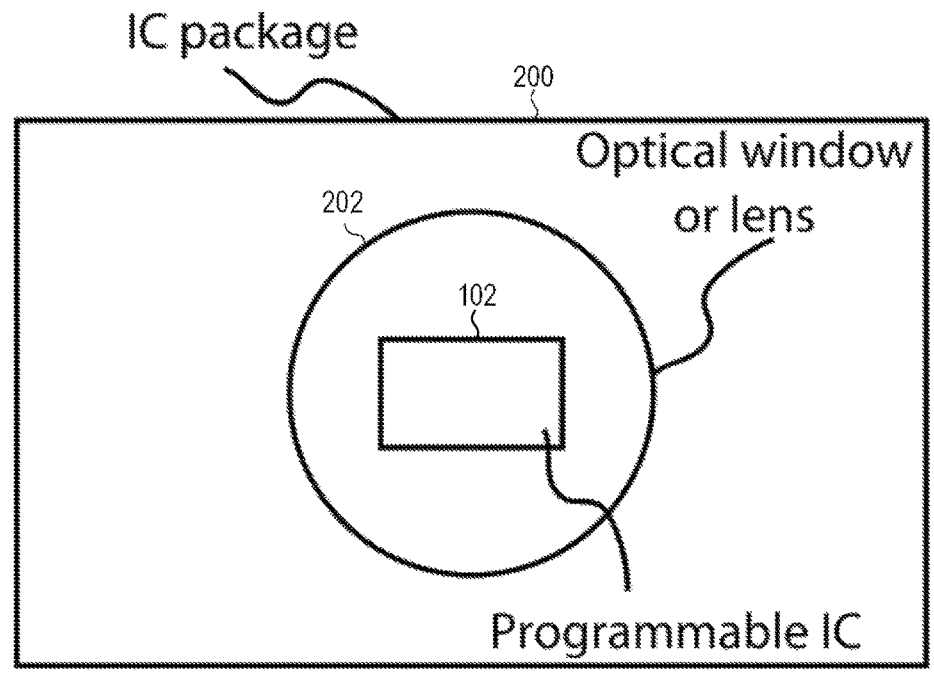
FIG. 3 shows a schematic view of an IC package incorporating the IC of FIG. 2 and having an optical window.
Figure 3:
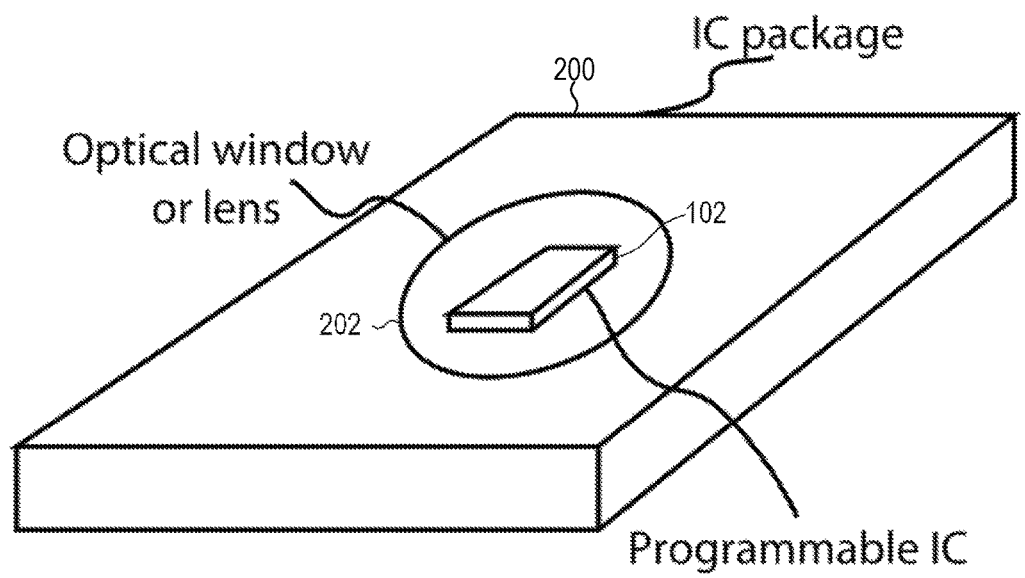

FIG. 3 shows an IC package 200 incorporating the IC 102 as well as an optical window 202. The window 202 may be of a polymer or plastic material and may be in the form of an optical element, e.g., a curved lens, to direct the passage of light.

Figure 4:
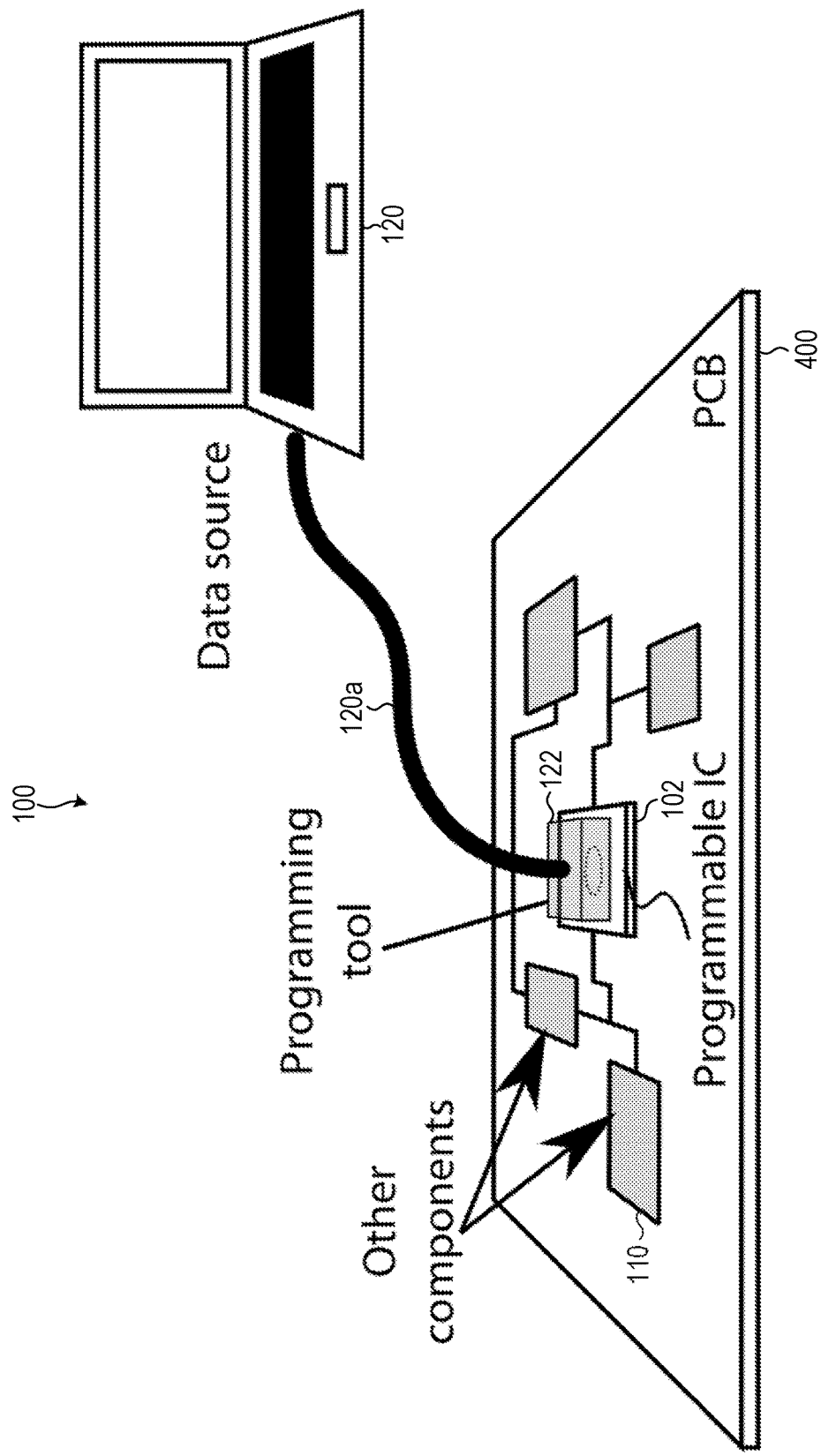
FIG. 4 shows a schematic view of the IC of FIG. 2 being programmed by placing a programming tool in close proximity.
Figure 5:
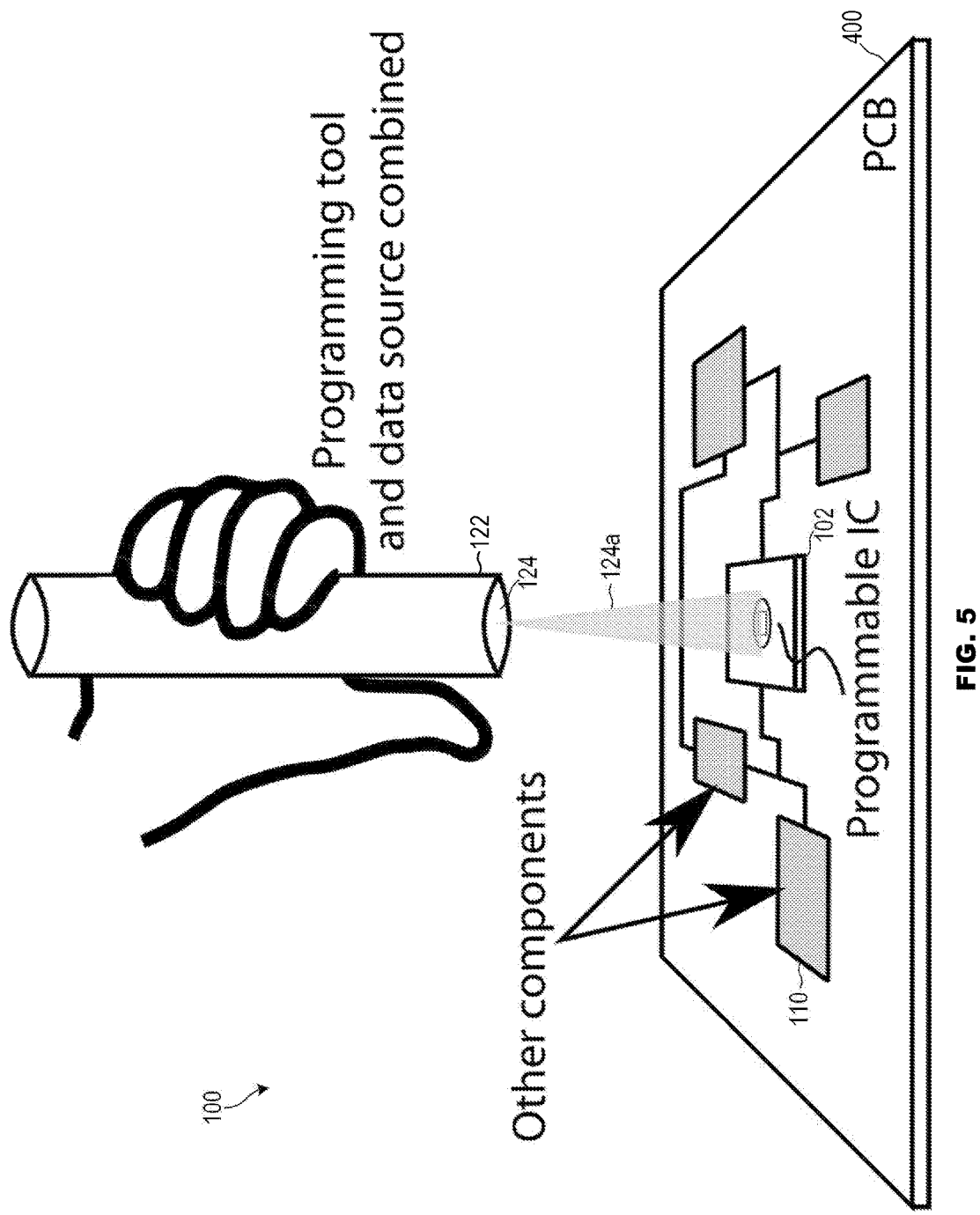
FIG. 5 shows a schematic view of the IC of FIG. 2 being programmed by placing a programming tool in medium proximity.

FIGS. 4-5 show two examples of a programming tool being applied to the IC 102 which has been mounted to a printed circuit board (PCB) 400. In FIG. 4, the programming tool 122 is close to, even abutting, the IC 102 but the optical link 124a (not apparent in FIG. 4) is still optical. In FIG. 5, the programming tool 122 is handheld and is held a short distance, e.g., 5-20 cm, from the IC 102 to establish the optical link 124a.

Figure 6:
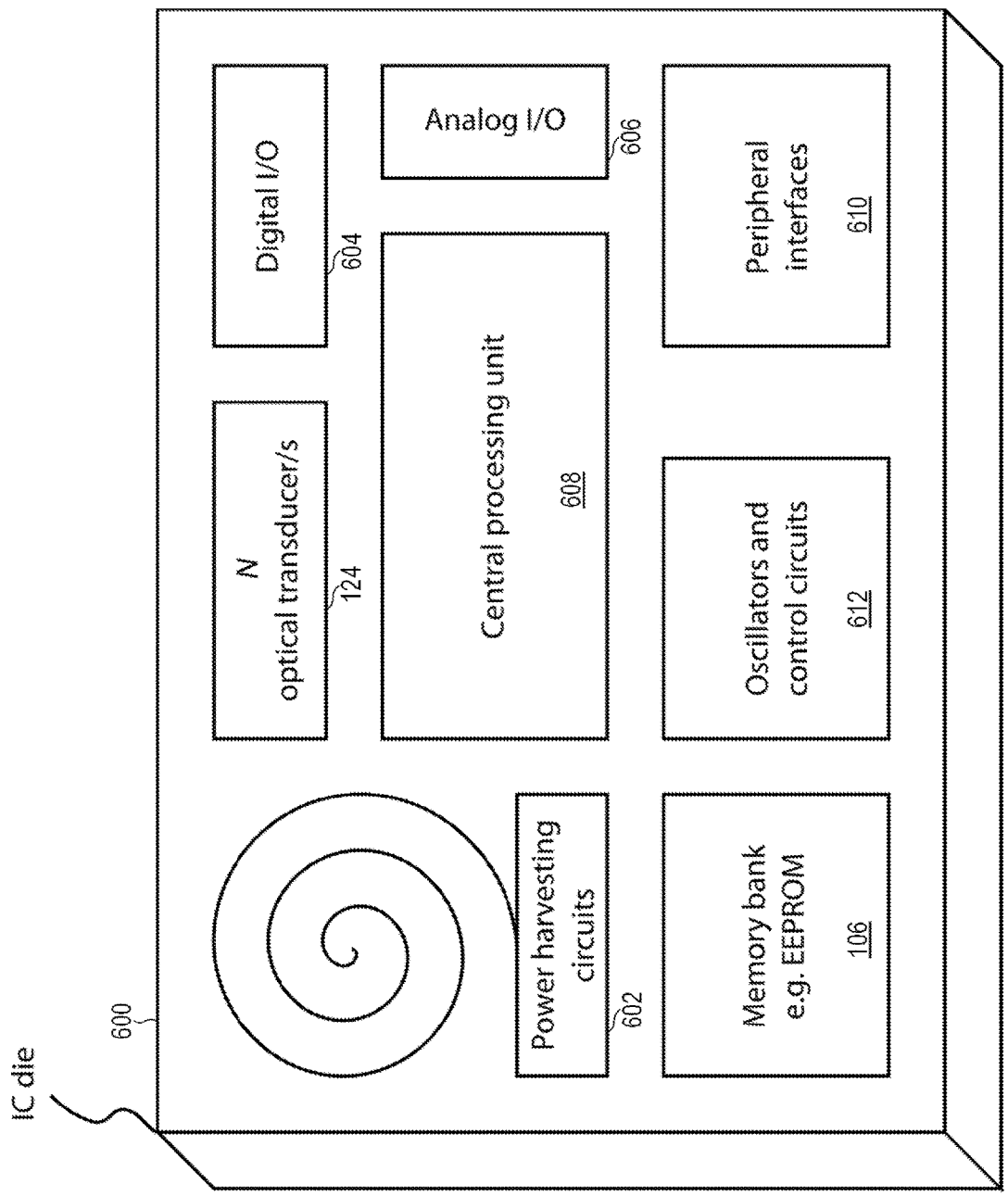
FIG. 6 shows a schematic view of an embodiment of the IC of FIG. 2 including energy scavenging/harvesting.

FIG. 6 shows an IC 600 in accordance with the disclosure which has energy scavenging/harvesting. The IC 600 has an energy harvesting component 602 render it unnecessary to supply the IC 600 with additional external power during the programming event. The energy harvesting component 602 is configured to harness/scavenge some of the power from the optical link 124a provided by the external transducer 124. The external transducer 124 is of higher power or efficiency to compensate for the lower power or efficiency of the integral transducer 104 and can supply sufficient power to enable the energy harvesting component 602 to provide the IC 600 with sufficient power to sustain the programming event.

The IC 600 also includes some additional components, such as a digital I/O 604, an analogue I/O 606, a central processing unit (CPU) 608, one or more peripheral interfaces 610, and associated oscillators and control circuits 612.

Figure 7:
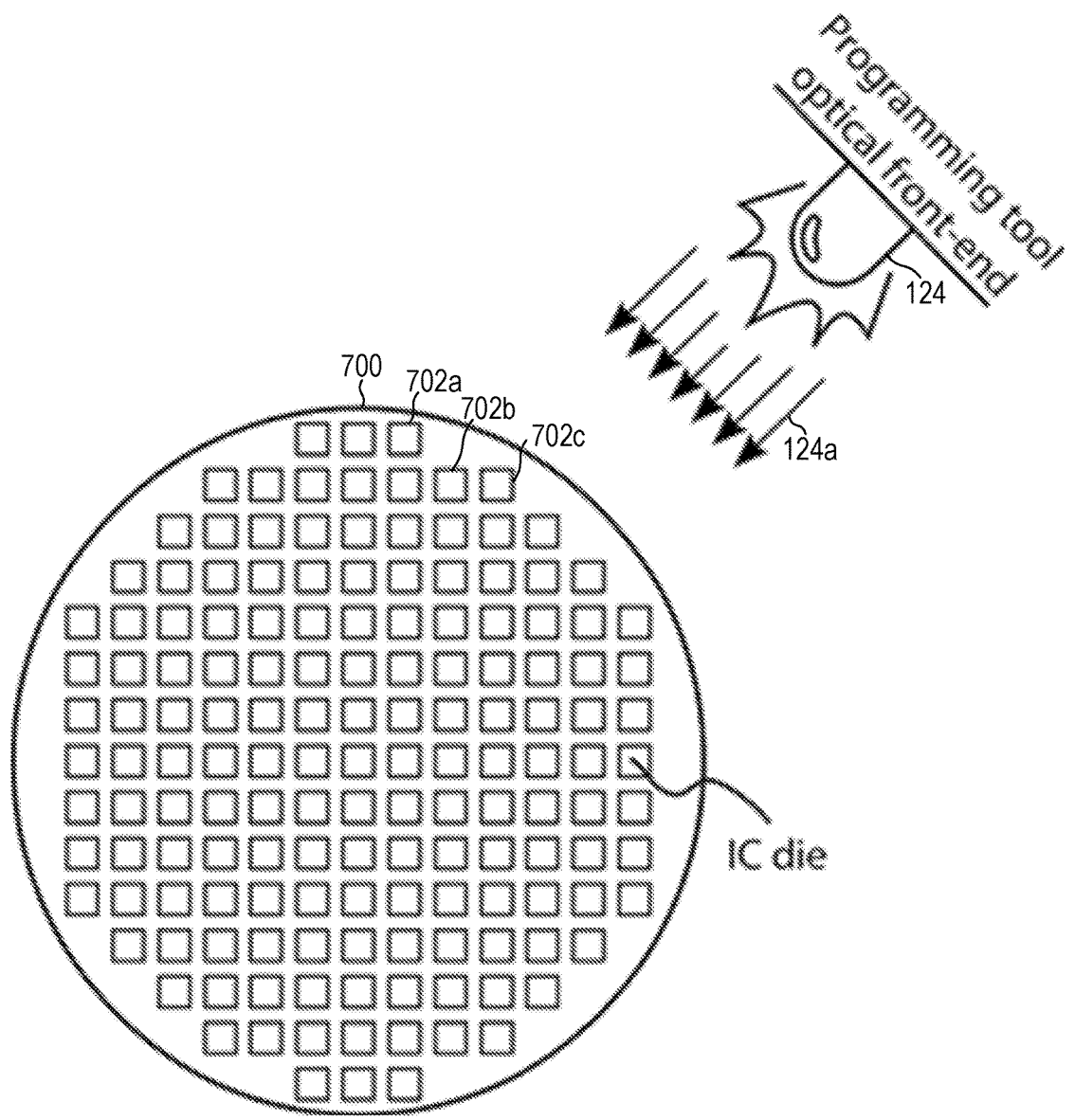
FIG. 7 shows a schematic view of a wafer containing plural ICs in accordance with the disclosure which can be batch-programmed.

FIG. 7 shows a wafer 700 comprising a batch or plurality of ICs 702a-702c prior to separation by dicing. The ICs 702a-702c are arranged proximate each other, on the wafer 700, and they are thus all in a receiving zone of the optical output 124a produced by the programming tool 122. Thus, each of the ICs 702a-702c can be programmed in a batch in a single programming event simultaneously from a single programming tool 122. Once programmed, the ICs 702a-702c can be diced or separated and then used in accordance with their programming.

Figure 8:
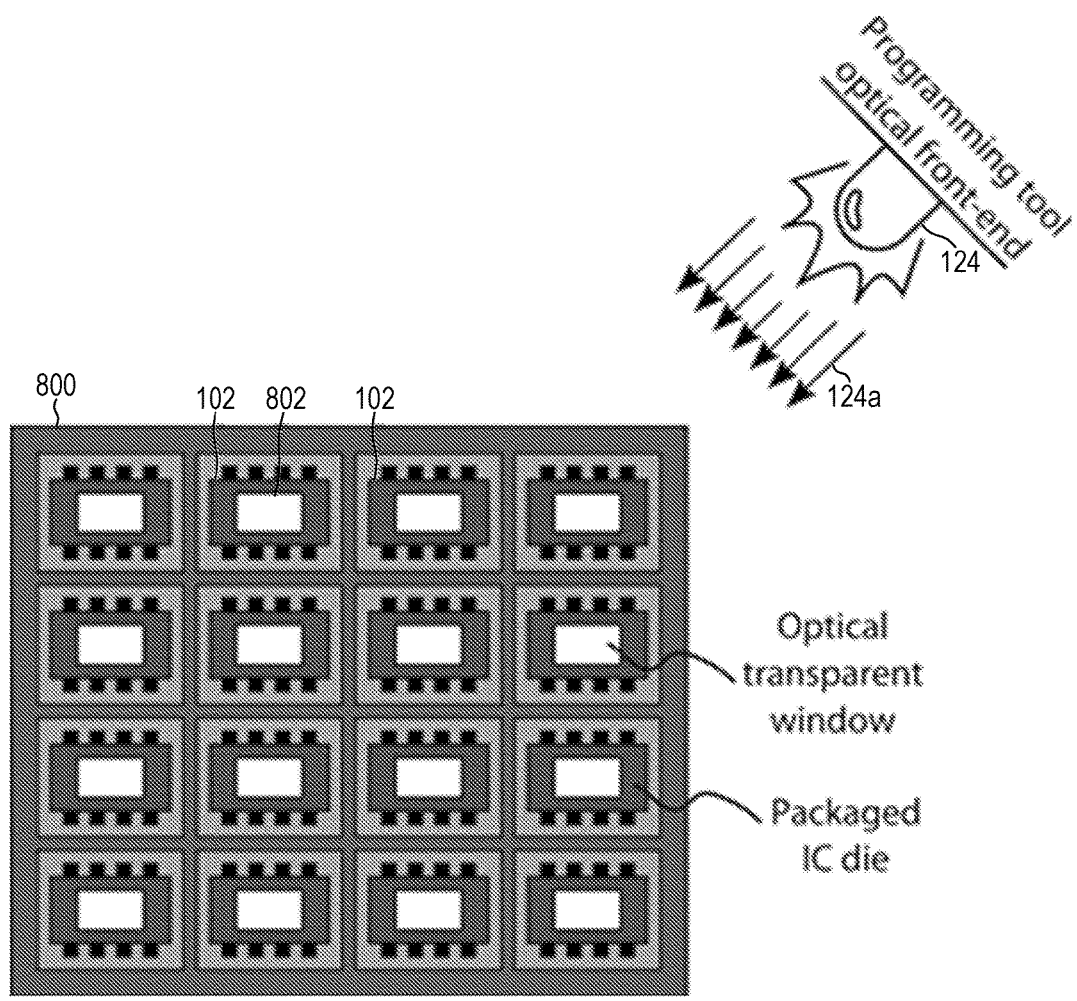
FIG. 8 shows a schematic view of a plurality of ICs of FIG. 2 arranged in a grid.

FIG. 8 illustrates an arrangement for programming multiple ICs 802, as in FIG. 7. In FIG. 8, packaged or completed ICs 102 are ranged in a goods container or tray 800 including a series of cavities with the ICs 102 provided therein and with windows 802 provided over each cavity thereby to expose the integral transducer 104 of each IC 102. The programming tool 122 can generate the optical programming signal 124a to program each of the ICs in a batch simultaneously. This can be convenient because typical finished goods containers are designed to fit into, and work with, automatic pick and place instrumentation for high throughput printed circuit board assembly.

Figure 9:
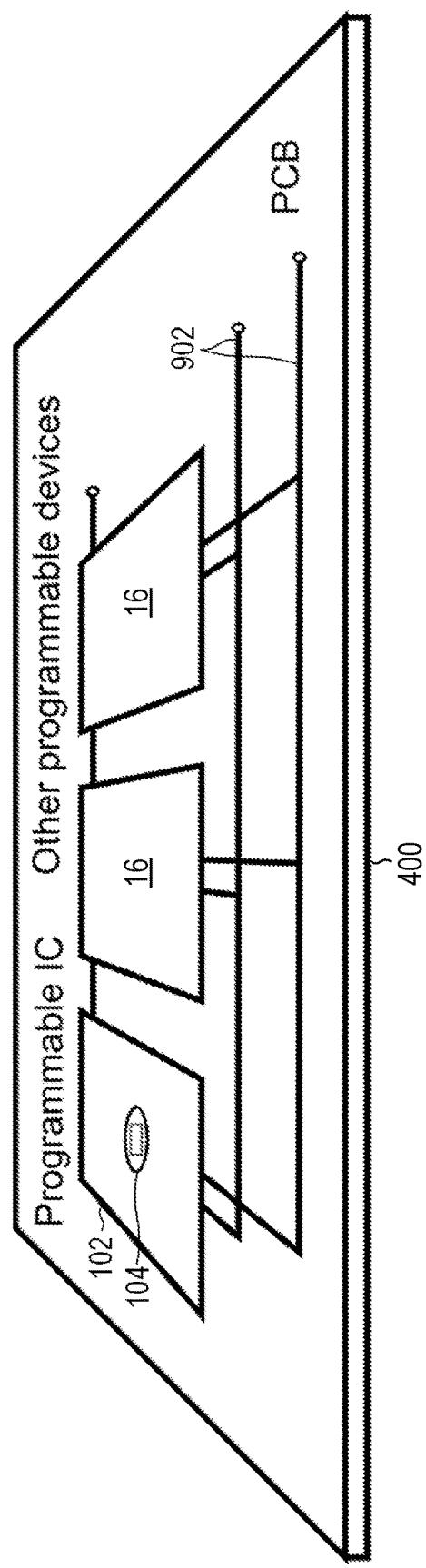
FIG. 9 shows a schematic view of the IC of FIG. 2 connected to a shared programming or debugging bus interface.

FIG. 9 illustrates an application of the IC 102 to permit even non-optically programmable ICs (e.g., PRIOR ART ICs 16). The optically-programmable IC 102 (in accordance with the disclosure) is connected to the other electrically programmable ICs 16 as a first point of entry into a shared programming/debugging bus interface 902. In this example, all programmable devices 102, 16 can be programmed using the programmable tool 122 which optically interacts solely with the first point of entry device (i.e., the IC 102) sharing the programming/debugging bus 902.

Different bus topologies may also be implemented. For example, in a star topology, each IC 102 may host its own optical front end and the programming tool 122 connects to each IC individually using fibres. This obviates the need for electrical connections between ICs and saves PCB space.

Figure 10:
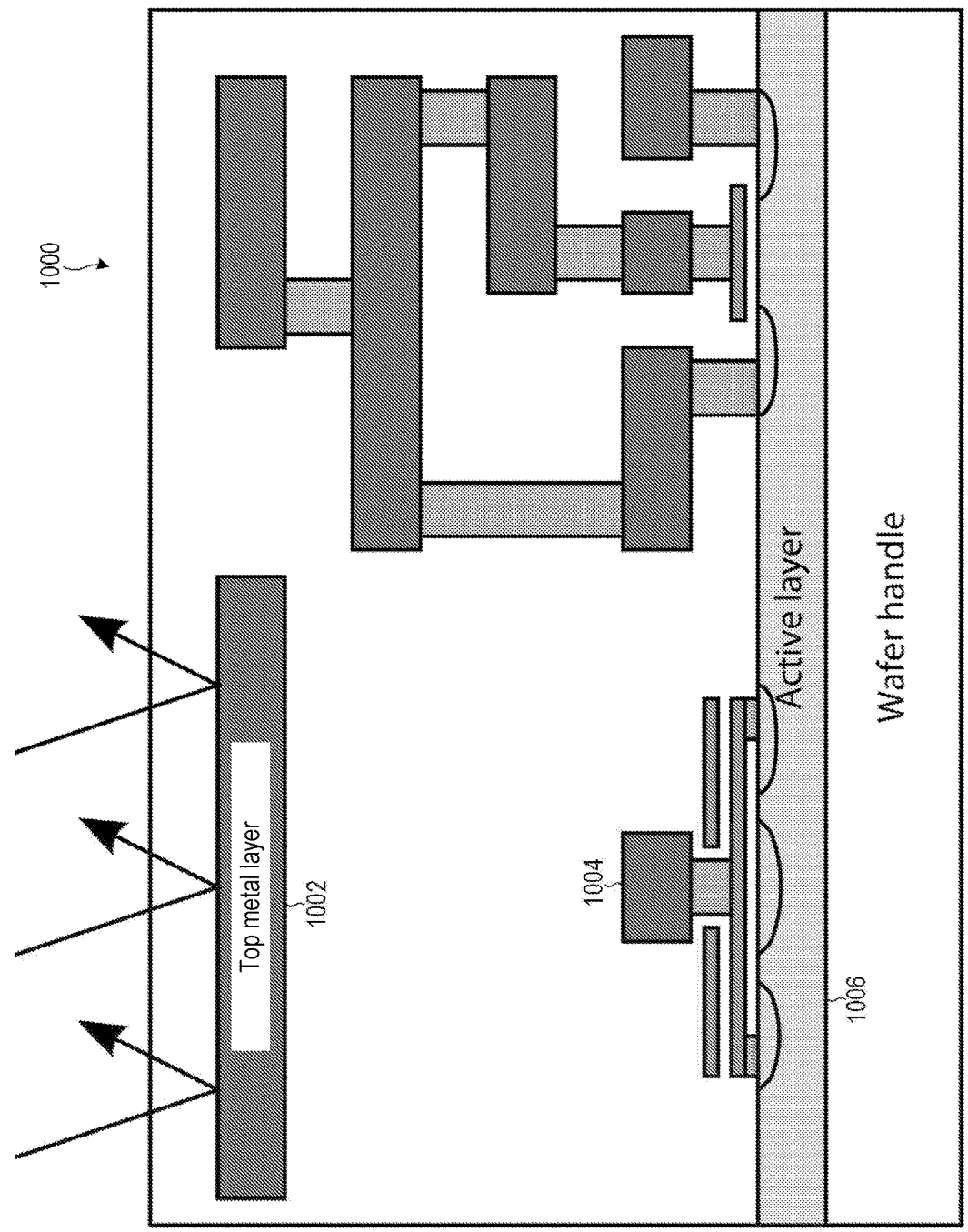
FIG. 10 shows a schematic view of an embodiment of an IC, in accordance with the disclosure, which has a barrier to selectively block incident light.

FIG. 10 illustrates an IC 1000 which has a barrier in the form of a top metal layer 1002 (in a standard process) to block light from some portions 1004 of the IC 1000. By way of theory, integrated optical detectors work on the principle of absorbing incident light, in the form of photons, in order to create an electron-hole pair, measurable as an electrical current. Numerous active devices which form part of other integrated components, such as amplifiers, oscillators etc., whose function is not to absorb incident photons will however also absorb photons and create an electron-hole pair. This can produce unwanted circuit behaviour or noise.

Additionally, non-volatile memory, e.g., an EPROM, is sensitive to ultraviolet light which enables the charge, typically stored on a floating gate, to leak and be lost. This can result in a complete erasure of the integrated memory. Although a silicon light emitter itself does not emit sufficient ultraviolet light in order to negatively affect integrated memories, other ambient light might under unique circumstances contain enough optical power to clear the on-chip memory through the optically transparent window.

Accordingly, the IC 1000 shields active devices 1004 which are sensitive to the incident photons in order to ensure proper functionality and memory retention. Fortunately, integrated circuit processes have a well-defined back-end-of-line stack and the metal and inter-metal layers can therefore through design changes be available to shield the integrated memory 106 residing in the active layer 1006. The shield 1002 could also be of an active nature in order to protect against non-invasive attacks on the IC in an attempt to re-engineer or copy the internal software.

(Although not ideal, additional layers not part of the standard processing steps could also be envisaged to be added on top of the semiconductor wafer to facilitate the shielding of the integrated memory 106 and active devices 1004 sensitive to the incident photons.)

The Applicant believes that the disclosure as exemplified has numerous advantages in that the problem described in the BACKGROUND OF DISCLOSURE may be overcome or at least alleviated and further provides additional benefits and efficiencies as described in the example embodiments.

ANNEXURE 1 (A1): INCORPORATION OF THE SPECIFICATION OF RELATED SOUTH AFRICAN PATENT APPLICATION NO. 2014/03994

A1: Field of Disclosure

This disclosure relates to an integrated circuit having an on-chip electroluminescent silicon light source arrangement which can provide an optical indication of the state of the integrated circuit.

A1: Background of Disclosure

Historically, integrated circuit (IC) display has been realised by means of an IC, an optical driver which may be integral with the IC or a discrete component, and a discrete optical emitter. With recent advances in IC design, silicon light sources have been integrated with the IC itself and this is referred to as an on-chip light source. A number of approaches exist where a silicon-compatible light source is integrated with a silicon substrate [1].

For complete integration, light sources should ideally be created using structures available in a standard CMOS/BiCMOS or SOI process used for typical ASIC integrated circuits. These include analogue, digital anil mixed signal integrated circuits.

There are generally two methods by which to generate light in a standard CMOS integrated circuit where no hybridisation is necessary:
  Radiative recombination of minority carriers through forward biased injection in a silicon pn-junction; and
  Radiative carrier interactions under high electric fields, observable when inducing carrier transport through reverse biased pn-junctions in avalanche breakdown.

The first technique emits light invisible to the human eye with a photon energy distribution around the band gap energy of silicon (approximately 1100 nm). The second technique emits a broad spectrum of light in the region of 400-900 nm, depending on the electric field profile. The current disclosure pertains to the second technique which emits visible light that is also capable of being detected by silicon itself. This is a unique feature of the disclosure described below.

Scientific advances in hot carrier electroluminescent light sources have enabled detectable light emission from light sources manufactured in silicon. Reducing the voltage and enabling circuit techniques that allow for direct interaction of these light sources with digital circuitry allow for the direct integration of these light sources as circuit components in analogue and digital systems on chip (SoC).

However, almost all of the on-chip light sources of which the Applicant is aware display an image or data (generally, an optical output) based on data which originates externally from the IC itself. In other words, the IC is configured to receive an input indicative of data to be displayed and then translate that input into an optical output via the on-chip light source.

The Applicant desires an IC having an on-chip light source which is operable to display information about the state of the chip itself. An IC, or integrated circuit, is seen as any semiconductor substrate which includes various electrical functions and circuitry, as well as additional functions such as electro-optical capabilities, integrated into a single body of that semiconductor. Examples include, but are not limited to, microprocessors, DRAM chips, dedicated EEPROMs and ASICs. Contactless probing has been explored using on-chip integrated light sources by a few authors in technical literature [2], but all of these rely on using on-chip silicon light sources in a single point in order to transmit information in a temporal one-dimensional manner, that is, by representing data in a linear time evolving sequence of optical pulses.

The Applicant accordingly desires a display arrangement which can display useful information about the state of the IC.

A1: Summary of Disclosure

Accordingly, the disclosure provides an integrated circuit (IC) having an on-chip electroluminescent silicon light source arrangement, characterised in that:
  the light source arrangement is a two-dimensional display arrangement; and
  the integrated circuit includes an on-chip modulator operable to modulate data indicative of a state of the integrated circuit for display by the display arrangement, thereby providing an optical representation of the state of the integrated circuit.

It should be noted that the primary function of the IC may not be to display its state. Instead, it may be programmed or configured to perform any number of tasks typically performed by ICs, and then as an adjunct to its primary task, display the optical representation of the state.

The light source arrangement may be a hot carrier electroluminescent light source arrangement. Conventionally, the high voltage required for hot carrier electroluminescence inhibits direct integration on a standard CMOS chip with the possibility of coexisting and interacting with other digital and lower voltage analogue components. Recent developments have allowed the latter to become possible and feasible.

The IC may have silicon as the body of semiconductor material. The IC may be manufactured in a standard CMOS process. The IC may be manufactured in a standard SOI-CMOS process.

The optical representation may include a human-readable representation. The optical representation may include alphanumeric characters or symbols recognisable to a chip developer or programmer. Instead, or in addition, the optical representation may include a machine-readable representation. Examples of two-dimensional (2D) machine-readable representations include QR codes or other two-dimensional barcodes.

The optical representation may be readable by a detector external to the IC. The detector may be a human. Instead, or in addition, the detector may be a computerised optical scanner, e.g., a 2D barcode reader.

It will be appreciated that by means of a detector (whether human or machine), the need for electrical probing may be eliminated. The IC may include an input arrangement, e.g. a photodetector, operable to receive a feedback signal from the detector.

The optical representation may be static. Instead, the optical representation may be dynamic or time-varying.

Differently stated, the optical representation may be of data associated internally with, or originating internally from, the IC. The data represented may be used for debugging or fault analysis of internal circuits or circuit elements by representing the scan path or similar JTAG elements of large digital circuits. Additionally, it may even become possible to reduce or eliminate certain diagnostic circuitry typically present on chip by providing a more efficient means of communicating off-chip.

It may be possible to monitor, represent, and display integrated registers (such as a stack of a microprocessor or states of certain data registers) used in the processing function of microprocessors. This may be a valuable means for in-circuit debugging and may assist to improve the quality of development enabling a developer to view the chip state directly on the IC. Internal memory element contents, such as the information stored in DRAM or SRAM, may be represented by the optical representation. This may render it possible to display private messages stored in on-board memory, replay stored data, and relay data stored from other originating sources, such as sensor inputs, for in situ observation. Educational and demonstrative use of the IC may assist an observer to understand the internal operation of ASICs, microprocessors, and FPGAs.

This disclosure may provide for a high information density transmission of the state with no need to extract the information electrically from the integrated circuit. This may result in faster IC testing operations (for example for informational or quality control purposes) before shipment, or to simply reduce the I/O count of the IC. Since the observer can be a human being, the eye being the detector, it is possible to effectively represent on-chip states in a format readable by humans.

The term "state" may include a representation of electrical conditions of circuit elements within the IC, such as the value of analogue voltages and currents of internal nodes and/or the values represented by digital circuit elements of both static and dynamic nature. The term "state" may include one or more of:
  information pertaining to memory contents of the integrated circuit;
  information pertaining to a scan path used for integrated circuit debugging; or
  information pertaining to a past or present state of the integrated circuit.

Two-dimensional display arrangements per se are not novel. Light sources that have been fabricated by using devices, structures and features that are part of a standard CMOS process, have been disclosed [3, 4]; importantly, however, these only represented information sourced externally from the IC.

The modulator may be analogue or digital. Information displayed by the display arrangement may be encoded to increase information transfer density.

The disclosure extends to a detection system which includes:
  an IC as defined above operable to display a machine-readable representation; and
  a computerised detector operable to read the machine-readable representation.

The disclosure extends to a method of representing a state of the IC as defined above, the method including:
  modulating, by means of a modular, data indicative of a state of the integrated circuit; and
  displaying the data in two dimensions on the display arrangement, thereby providing an optical representation of the state of the integrated circuit.

A1: Detailed Description of Example Embodiment

The following description of the disclosure is provided as an enabling teaching of the disclosure. Those skilled in the relevant art will recognise that many changes can be made to the embodiment described, while still attaining the beneficial results of the present disclosure. It will also be apparent that some of the desired benefits of the present disclosure can be attained by selecting some of the features of the present disclosure without utilising other features. Accordingly, those skilled in the art will recognise that modifications and adaptations to the present disclosure are possible and can even be desirable in certain circumstances, and are a part of the present disclosure. Thus, the following description is provided as illustrative of the principles of the present disclosure and not a limitation thereof.

Figure 11:
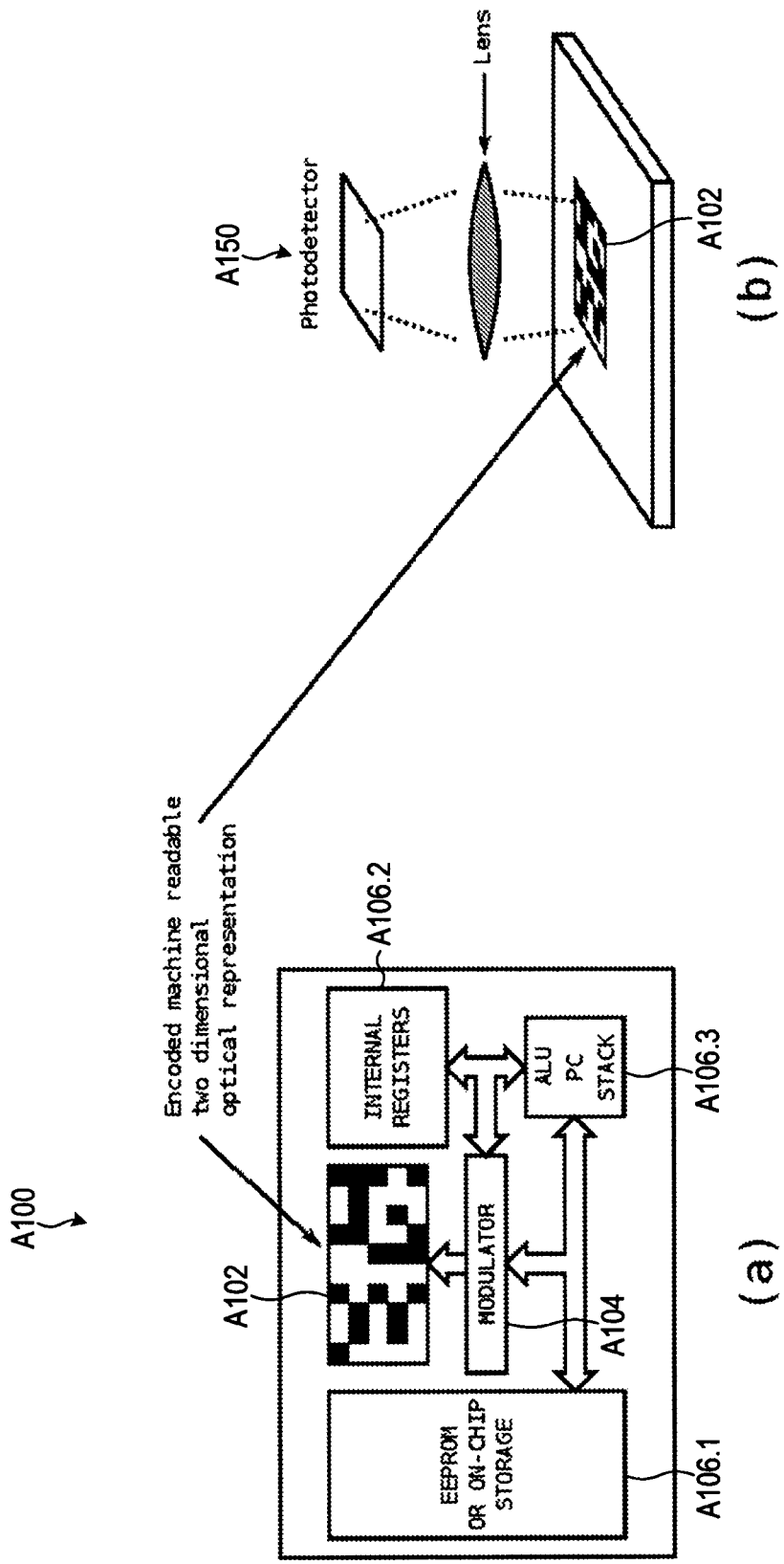
FIG. 11 shows a schematic view of a first embodiment an IC in accordance with the disclosure.

FIG. 11 illustrates a first embodiment of an IC A100 in accordance with the disclosure. The IC A100 has an on-chip electroluminescent silicon light source arrangement which is a two-dimensional display arrangement A102. The display arrangement A102 can present a simple monochrome display.

The IC A100 also has an on-chip modulator A104 which is operable to modulate data indicative of a state of the IC A100 for display by the display arrangement A102, thereby providing an optical representation of the state of the IC A100. The data may originate from a number of potential on-chip sources, such as on-chip storage (e.g., an EEPROM) A106.1, internal registers A106.2, or an internal stack A106.3. Accordingly, instead of the data for display originating from an external source (as is the case with all other two-dimensional ICs of which the Applicant is aware), the data originates from within the IC A100, hence being indicative of a state of the IC A100.

In this embodiment, the modular A104 is configured to display a machine-readable version of the state of the IC A100. Accordingly, to an untrained human eye, the pattern on the display may look like a matrix of random squares, similar to a QR code. However, to a complemental computerised detector A150 having an optical stack and photodetector combination, the optical representation on the display arrangement A102 can be imaged, interpreted, and (if desired) acted upon. The form of the detector A150 is not prescribed. For example, it could resemble a barcode scanner which can be wielded by an operator, or it could be integrated into part of an automatic production process.

Aside from the display arrangement A102 and the modulator A104, the IC A100 resembles a typical microprocessor.

Figure 12:
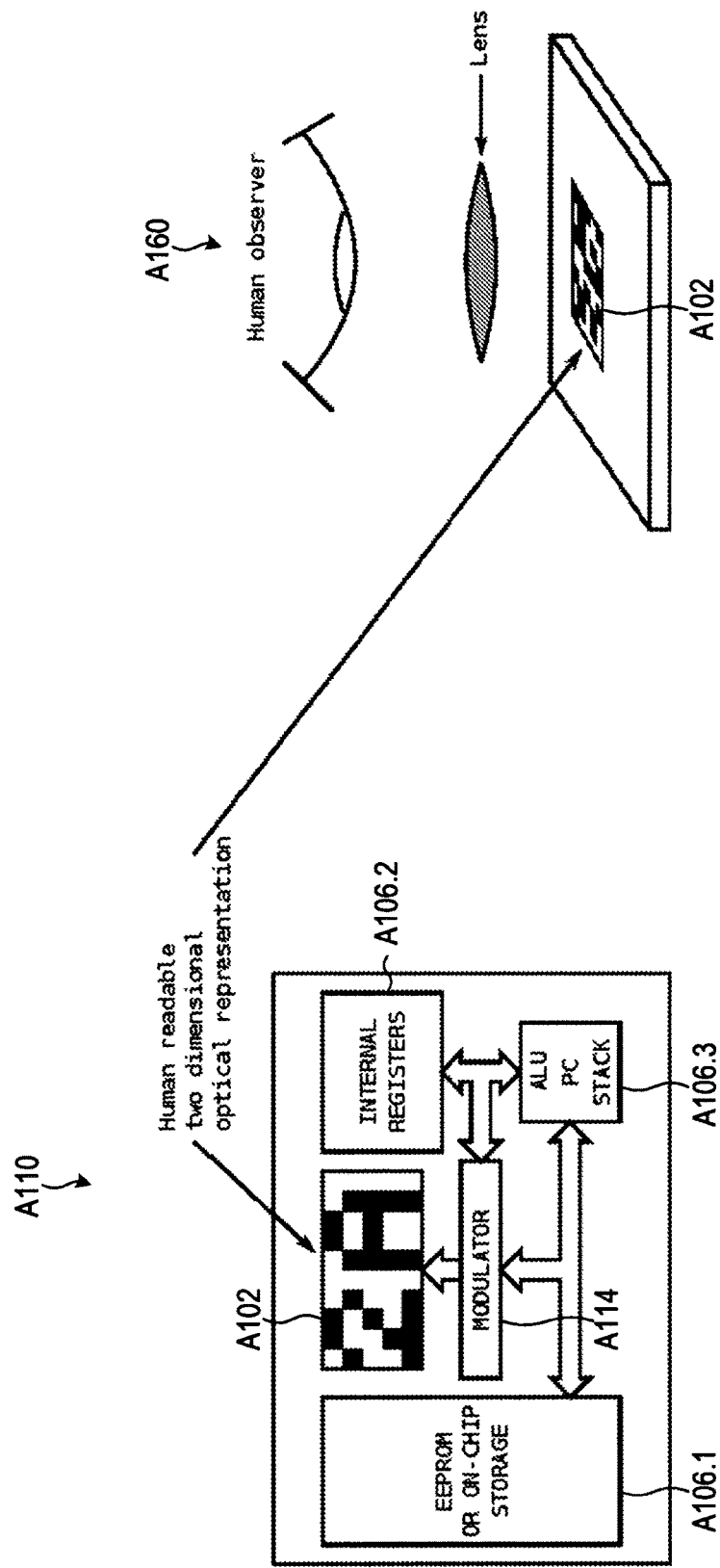
FIG. 12 shows a schematic view of a second embodiment an IC in accordance with the disclosure.

FIG. 12 illustrates a slightly different embodiment of an IC A110 in accordance with the disclosure. In the FIGS, the same numerals refer to the same or similar parts. The IC A110 differs from that of FIG. 11 in that a modulator A114 has been configured to provide human readable indicia on the display arrangement A102. The remaining components are otherwise identical.

The modulator A114 can display, for example, alphanumeric characters on the display arrangement A102. In the illustrated example, "2A" is displayed. The resolution is about 5×10 and there is thus not much available space but it can still be read by a human eye A160. In other embodiments, the resolution of the display arrangement A102 could be higher. The information displayed ("2A") could be indicative of data originating in any of the internal structures A106.1-A106.3 which is indicative of the state of the IC A110.

Figure 1:
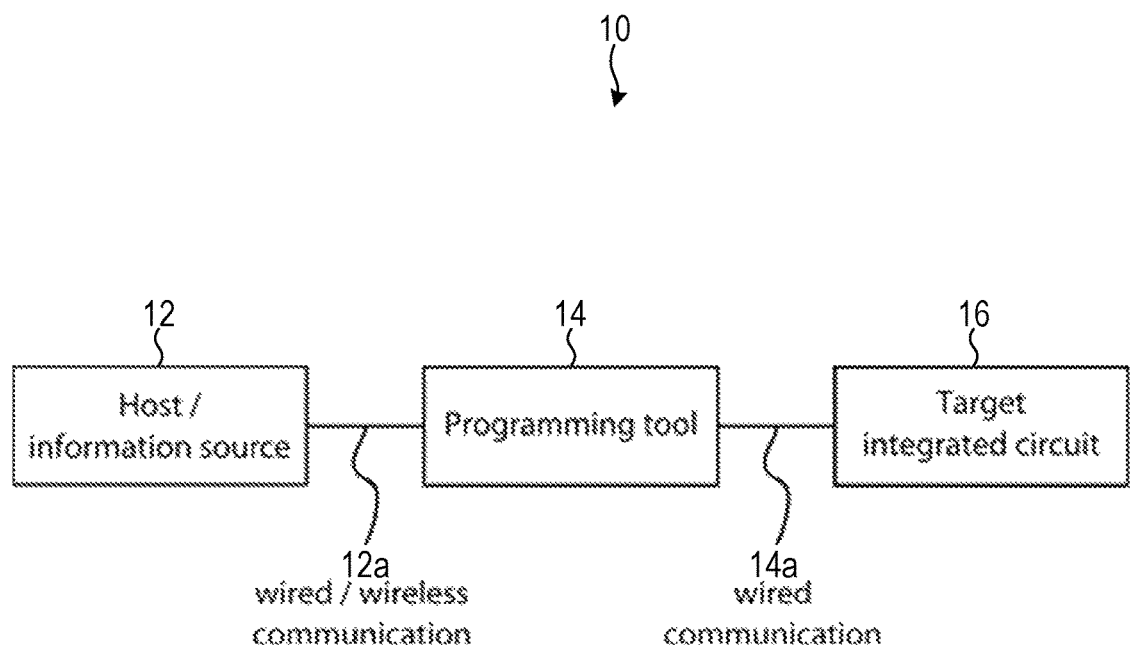
FIG. 1 shows a schematic view of a PRIOR ART integrated circuit programming system.
Figure 13:
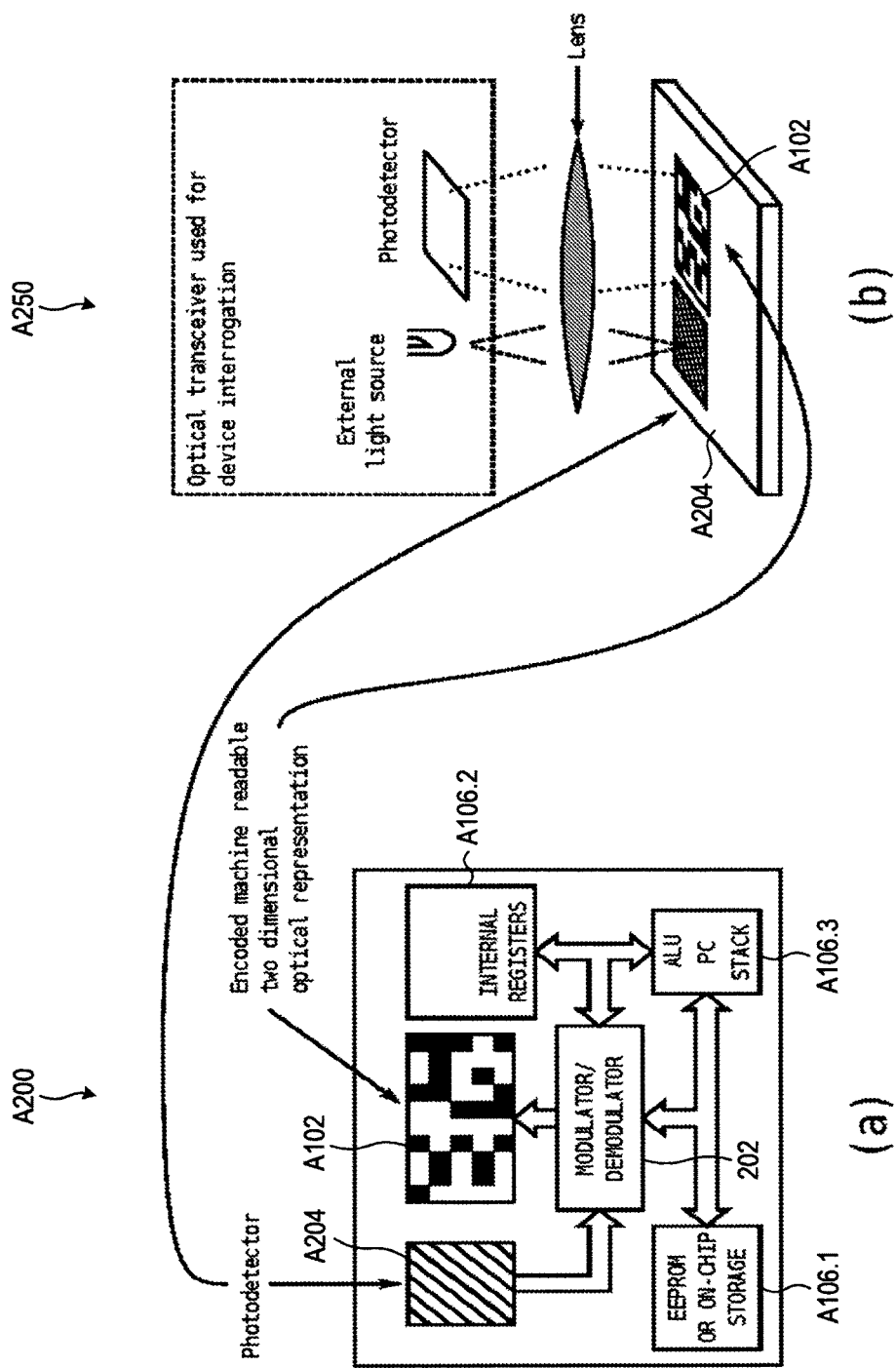
FIG. 13 shows a schematic view of a third embodiment an IC in accordance with the disclosure.

FIG. 13 illustrates a third and more developed embodiment of an IC A200 in accordance with the disclosure. The IC A200 has a modulator/demodulator A202 and an input arrangement in the form of a photodetector A204. Instead of a mere detector A150 as in FIG. 1, there is an interrogator A250 which, in addition to an optical stack and photodetector combination, includes a phototransmitter or other light source to communicate to the IC A200 via the photodetector A204. Accordingly, complete two way interrogation is possible without electrically interacting with the IC A200 through conventional I/O methods.

The Applicant believes that the disclosure as exemplified is advantageous as it provides an IC A100, A110, A200 which can, without physical or electrical contact, display pertinent information relating to its state. This can include data relevant to a manufacturer, programmer, user, etc. The state can include information pertaining to memory contents, a scan path used for integrated circuit debugging, a past or present state of the IC A100, A110, A200.

No extraneous components are required, because the display arrangement A102 is on-chip. Information can thus be displayed quickly, accurately, and securely.

A1: References

[1] A. Fang, H. Park, O. Cohen, R. Jones, M. Paniccia, and J. Bowers, "Electrically pumped hybrid AlGaInAs-silicon evanescent laser," Opt. Express 14, 9203-9210, 2006.
[2] S. Sayil, D. Kerns, and S. Kerns, "All-silicon optical contactless testing of integrated circuits," International Journal of Electronics, vol. 89, no. 7, pp. 537-547, 2002.
[3] A. R. Chen, A. I. Akinwande, and H.-S. Lee, "CMOS-based microdisplay with calibrated back-plane," IEEE J. Solid-State Circuits, vol. 40, no. 12, pp. 2746-2755, December 2005.
[4] P. J. Venter, A. C. Alberts, M. du Plessis, T.-H. Joubert, M. E. Goosen, C. Janse van Rensburg, P. Rademeyer and N. M. Fauré, "A CMOS microdisplay with integrated controller utilizing improved silicon hot carrier luminescent light sources," in Proc. SPIE 8643, Advances in Display Technologies III, 864309, 2013.

The invention claimed is:

1. A programmable integrated circuit (IC) comprising a single body of a non-hybrid indirect band gap semiconductor, the IC comprising:
   at least one optical transducer as an integral part of the IC on the same body of semiconductor, the optical transducer being operable to receive an optical input indicative of programming instructions, wherein the optical transducer additionally serves as an on-die light emitter operable to provide an optical output; and
   at least one storage element communicatively coupled to the optical transducer and being operable to store thereon the programming instructions or an adaptation thereof,
wherein the programming instructions received via the optical input are configured to direct the operation of the IC.

2. The IC as claimed in claim 1, wherein the storage element in an integral part of the same body of semiconductor as the IC.

3. The IC as claimed in claim 1, wherein the storage element is external to the IC but connected thereto by a communication link or bus.

4. The IC as claimed in claim 1, wherein the optical transducer is an optical detector or photodetector.

5. The IC as claimed in claim 1, wherein the optical transducer provides bi-directional communication capabilities.

6. The IC as claimed in claim 1, wherein the body of semiconductor is predominantly silicon.

7. The IC as claimed in claim 6, wherein the body of semiconductor is crystalline silicon.

8. The IC as claimed in claim 6, which employs a CMOS, BiCMOS, or SOI process.

9. The IC as claimed in claim 1, wherein the optical transducer and associated electrical circuitry are operable to extract electrical power from at least a portion of the optical input, thereby to power the electrical circuitry to support a programming event.

10. The IC as claimed in claim 9, wherein the electrical circuitry includes an energy harvesting component operable to harvest energy from optical input, rendering it unnecessary to supply the IC with additional external power during the programming event.

11. The IC as claimed in claim 1, which includes a window containing a polymer over the optical transducer.

12. The IC as claimed in claim 11, wherein the window is curved and serves as an optical element to manipulate the optical input.

13. The IC as claimed in claim 1, which comprises a barrier to block the input optical signal from selected portions of the IC.

14. An IC programming system which comprises:
   the IC as claimed in claim 1; and
   an external programming tool having at least one optical transducer (the external transducer) operable to interact with the optical transducer (the integral transducer) of the IC.

15. The IC programming system as claimed in claim 14, wherein:
   the integral transducer is lower power or efficiency; and
   external transducer is higher power or efficiency to compensate for the lower power or efficiency of the integral transducer.

16. The IC programming system as claimed in claim 14, which comprises a plurality of the ICs and one of the external programming tools which is operable to program the plurality of ICs in a batch.

17. The IC programming system as claimed in claim 16, wherein the programming tool is operable to produce a single optical output which is receivable by each of the ICs as the optical input.

18. The IC programming system as claimed in claim 14, wherein the IC is linked to a plurality of non-optically programmable ICs and in which the IC serves as a point of entry into a shared programming or debugging bus interface.

19. The IC as claimed in claim 1, wherein the single body of non-hybrid indirect band gap semiconductor is a homogenous semiconductor.

20. A method of programming or interrogating a programmable IC comprising a single body of a non-hybrid indirect band gap semiconductor, the method comprising:
- receiving, by at least one optical transducer as an integral part of the IC on the same body of semiconductor, an optical input indicative of programming instructions;
- storing, on at least one storage element communicatively coupled to the optical transducer, the programming instructions or an adaptation thereof; and
- providing, by the at least one optical transducer which additionally serves as an on-die light emitter operable to provide an optical output, wherein the programming instructions received via the optical input are configured to direct the operation of the IC.

21. The method as claimed in claim 20, which comprises harvesting, by an energy harvesting component, energy from optical input, rendering it unnecessary to supply the IC with additional external power during a programming event.

22. The method as claimed in claim 20, which comprises programming each IC in a batch of ICs by a single optical input received by each of the ICs.

23. The method as claimed in claim 20, which comprises:
- linking the IC to a plurality of non-optically programmable ICs via a shared programming or debugging bus interface; and
- directing the optical input to the IC, wherein the optical input is then communicated via the shared programming or debugging bus interfaces to the non-optically programmable ICs.

* * * * *